(12) United States Patent
Kurtz et al.

(10) Patent No.: US 6,229,427 B1
(45) Date of Patent: *May 8, 2001

(54) COVERED SEALED PRESSURE TRANSDUCERS AND METHOD FOR MAKING SAME

(75) Inventors: Anthony D. Kurtz, Teaneck; Alexander A. Ned, Bloomingdale, both of NJ (US)

(73) Assignee: Kulite Semiconductor Products Inc., Leonia, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/897,470

(22) Filed: Jul. 21, 1997

Related U.S. Application Data

(63) Continuation of application No. 08/709,139, filed on Sep. 6, 1996, now abandoned, which is a continuation of application No. 08/502,125, filed on Jul. 13, 1995, now abandoned.

(51) Int. Cl.⁷ ........................................................ H01C 10/10
(52) U.S. Cl. ................................. 338/42; 338/2; 73/721; 73/727
(58) Field of Search ............................. 338/2–5, 36, 42, 338/226, 230, 234; 73/721, 727

(56) References Cited

U.S. PATENT DOCUMENTS

| | | | |
|---|---|---|---|
| 3,764,950 | * 10/1973 | Wallia | 338/2 |
| 3,800,264 | * 3/1974 | Kurtz et al. | 338/2 |
| 3,819,431 | * 6/1974 | Kurtz et al. | 156/645.1 |
| 4,236,137 | 11/1980 | Kurtz et al. . | |
| 4,295,115 | * 10/1981 | Takahashi et al. | 338/4 |
| 4,314,226 | * 2/1982 | Oguro et al. | 338/4 |
| 4,410,871 | * 10/1983 | Mallon et al. | 338/5 |
| 4,672,354 | * 6/1987 | Kurtz et al. | 338/4 |
| 4,739,298 | * 4/1988 | Kurtz et al. | 338/2 |
| 4,764,747 | 8/1988 | Kurtz et al. . | |
| 4,823,605 | * 4/1989 | Stein | 73/727 |
| 4,853,669 | * 8/1989 | Guckel et al. | 338/4 |
| 4,861,420 | * 8/1989 | Knutti et al. | 437/901 |
| 5,165,282 | * 11/1992 | Nakamura et al. | 73/727 |
| 5,207,102 | * 5/1993 | Takahashi et al. | 73/727 |
| 5,220,838 | * 6/1993 | Fung et al. | 73/721 |
| 5,286,671 | * 2/1994 | Kurtz et al. | 437/901 |

\* cited by examiner

*Primary Examiner*—Karl D. Easthom
(74) *Attorney, Agent, or Firm*—Arthur L. Plevy; Duane, Morris & Heckscher

(57) ABSTRACT

A method for sealing a transducer of a type having a diaphragm with an active region and an inactive region, a stress sensing network associated with the active region of the diaphragm, contacts associated with the inactive region of the diaphragm, and lead-outs for coupling the stress sensing network to the contacts. The method comprises oxidizing the transducer to provide a first oxide layer which covers the diaphragm, the stress sensing network, the lead-outs and the contacts. Next, a layer of semiconductive material is deposited over the first oxide layer and is then planarized to provide a planar surface having a substantially flat and bondable surface. Finally, a cover member is bonded to the planar surface of the layer which covers the inactive region of the diaphragm to hermetically seal the stress sensing network and thereby provide a sealed transducer.

13 Claims, 14 Drawing Sheets

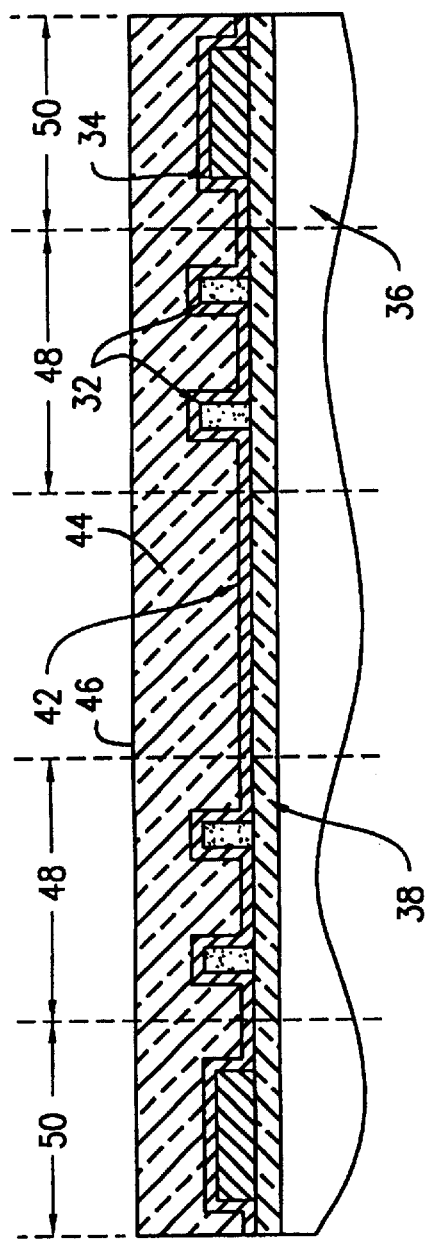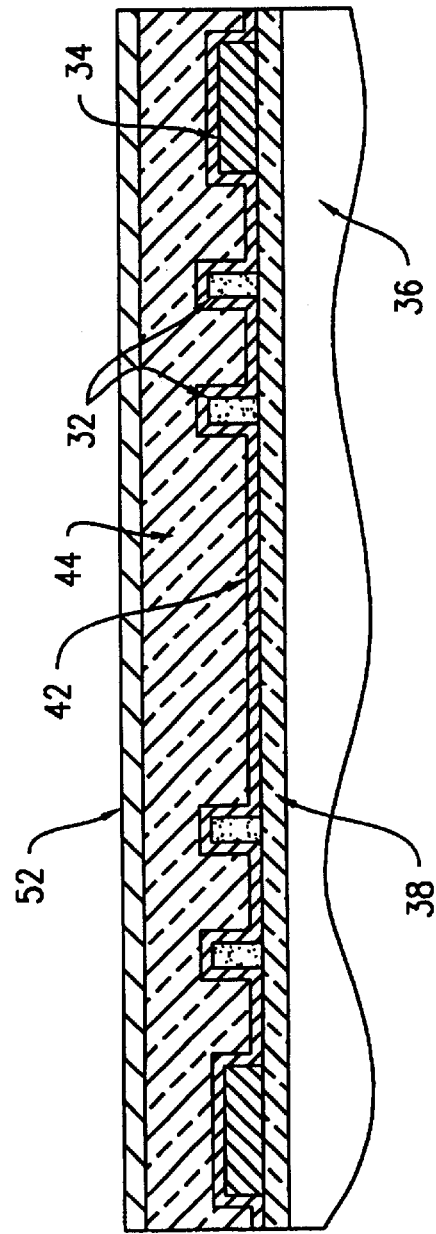

COVERED SEALED PRESSURE TRANSDUCERS AND METHOD FOR MAKING SAME

This is a continuation of application Ser. No. 08/709,139, filed Sep. 6, 1996, entitled COVERED, SEALED PRESSURE TRANSDUCERS AND METHOD FOR MAKING SAME, which is a continuation of Ser. No. 08/502,125, filed on Jul. 13, 1995, now abandoned.

FIELD OF INVENTION

The present invention relates generally to semiconductor pressure transducers, and more particularly to semiconductor pressure transducers having sealed stress sensing networks.

BACKGROUND OF THE INVENTION

Semiconductor pressure transducers are frequently used in applications which require operation in harsh environments that are corrosive and/or involve high temperatures. Accordingly, the stress sensing network of transducers used in such applications, must be protected from these harsh environmental conditions in some way in order for the transducer to remain operational over extended periods of time. In the past, surface over-coatings such as silicon nitride, silicon dioxide and the like, have been provided over the stress sensing network to protect it from harsh operating environments. However, such coatings provide only partial protection as the metallized contact areas of the sensing network remain exposed, which presents problems in applications which involve corrosive environments.

One method which enables the transducer to remain operational in corrosive and high temperature environments involves exposing the backside of the transducer to ambient pressure while hermetically sealing the stress sensing network located on the frontside thereof, in the active portion of the diaphragm surface. Such a method is described in co-pending U.S. patent application Ser. No. 08/458,405 filed on Jun. 2, 1995 entitled: HERMETICALLY SEALED TRANSDUCER AND METHODS FOR PRODUCING THE SAME, by A. D. Kurtz and assigned to Kulite Semiconductors Products, the assignee herein. The co-pending application describes a hermetic seal which utilizes a PYROCERAM glass frit or similar means, to bond a cover member to the frontside of the transducer to hermetically seal the sensing network.

The glass must be used in the above-described application to bond the cover member to the inactive portion of the diaphragm because the fabrication processes used in forming the sensing network of the transducer result in raised or lowered surface features depending on whether the transducer has a silicon-on-oxide (silicon-on-silicon) structure or a diffused non-implanted structure. The raised or lowered surface features such as where the sensing network extends into the contact areas, are not planar with the underlying substrate. This makes it virtually impossible to form a hermetic seal by electrostatically or fusion bonding a cover member to the inactive portion of the diaphragm. For instance, in a silicon-on-oxide transducer structure, the entire silicon network and particularly, the regions on the inactive portion of the diaphragm leading to the metalized contact areas (lead-outs) are elevated from the oxide by several microns. Moreover, a finite space is provided between these raised lead-outs on the order of mils to prevent them from electrically shorting together. The step height of the lead-outs and the finite spaces therebetween create gaps between the cover member and the inactive portion of the diaphragm. These gaps make it virtually impossible to form a hermetic seal between the cover and the inactive portion of the diaphragm by electrostatic or fusion bonding and thus, a glass frit must be used to fill the gaps to create a hermetic cover.

Although the glass frit enables the cover member to be bonded to the inactive portion of the diaphragm to hermetically seal the stress sensing network, there are problems associated with this method. For example, the glass frit has a tendency to flow onto the diaphragm during the high temperature sealing process which causes the performance of the sensors to degrade. There are also thermal mismatching issues and other process compatibility issues which require consideration when using a glass frit. All of this makes the glass frit a difficult material to use for fabricating hermetically sealed covers.

It is, therefore, an object of the present invention to provide an improved method for hermetically sealing a semiconductor pressure transducer which substantially eliminates the use of a glass frit to bond a cover member to a transducer.

SUMMARY OF THE INVENTION

A method for hermetically sealing a transducer of a type having a diaphragm with an active region and an inactive region, stress sensing means associated with the active region of the diaphragm, contact means associated with the inactive region of the diaphragm, and interconnection means for coupling the stress sensing means to the contact means. The method comprises oxidizing the transducer to provide a first oxide layer which covers the diaphragm, the stress sensing means, the interconnection means and the contact means. A layer of semiconductive material is then deposited over the first oxide layer. The layer of semiconductive material is then planarized to provide a planar surface having a substantially flat bondable surface. Finally, a cover member is bonded to the planar surface of the semiconductive layer in the area covering the inactive region of the diaphragm to hermetically seal the stress sensing network and thereby provide a hermetically sealed transducer.

BRIEF DESCRIPTION OF THE DRAWINGS

For a detailed understanding of the present invention, reference should be made to the following detailed description taken in conjunction with the accompanying drawings wherein:

FIGS. 3B–3F are cross-sectional views depicting the fabrication steps which enable a cover to be hermetically bonded to the transducer of FIGS. 3A and 3B using fusion or electrostatic bonding;

FIG. 3G is a top view of the transducer shown in FIG. 3F;

DETAILED DESCRIPTION OF THE INVENTION

Figure 1A:
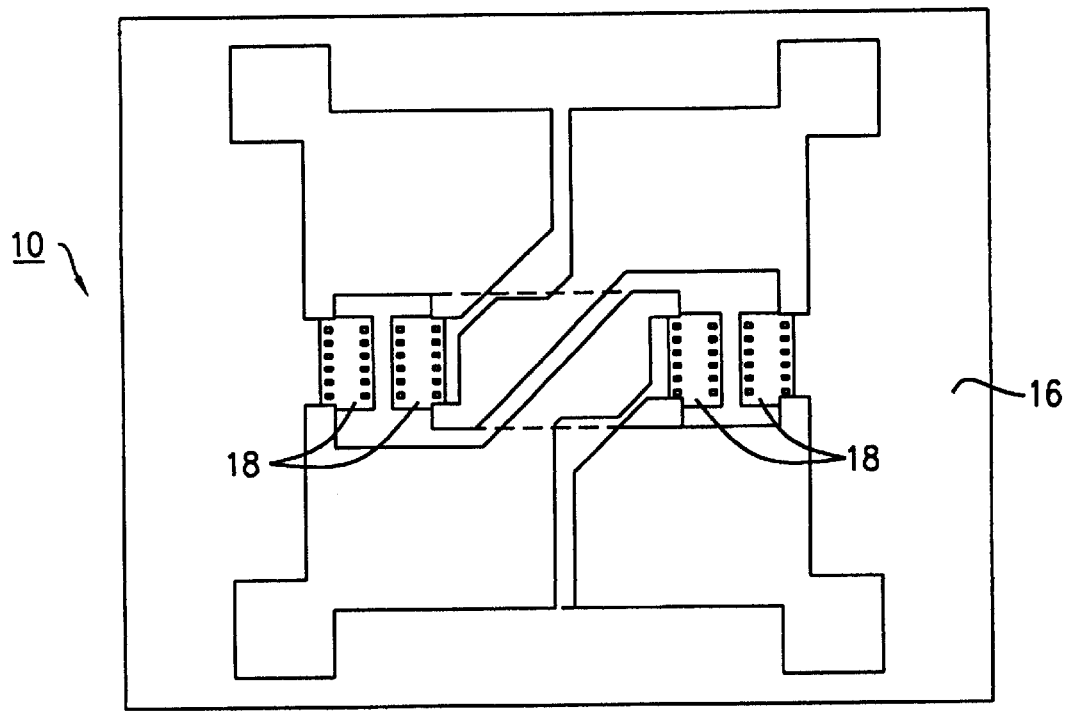
FIG. 1A is a top view depicting a silicon-on-oxide pressure transducer.
Figure 1B:
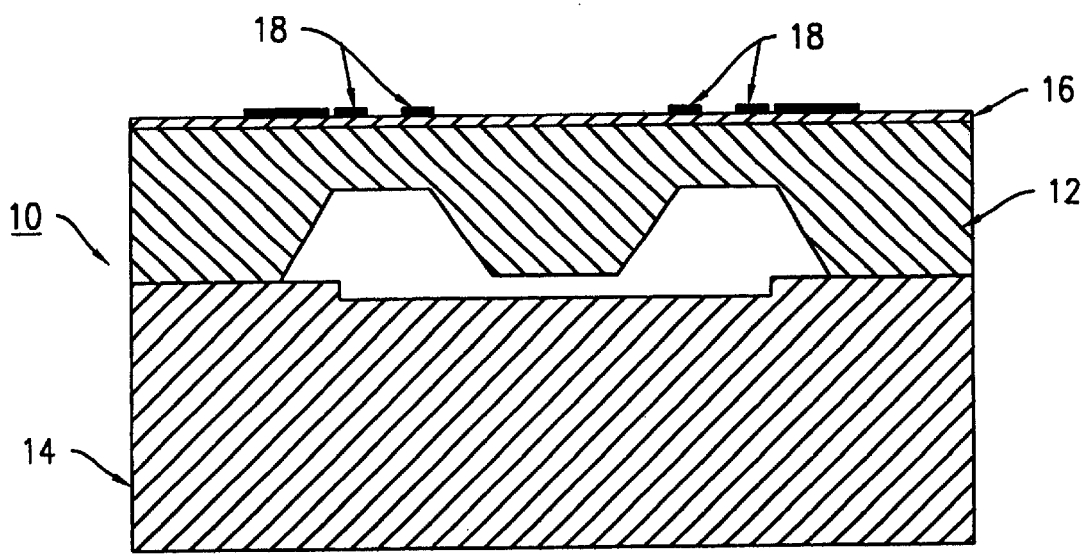
FIG. 1B is a cross-sectional view depicting of the silicon-on-oxide pressure transducer of FIG. 1A.
Figure 1C:
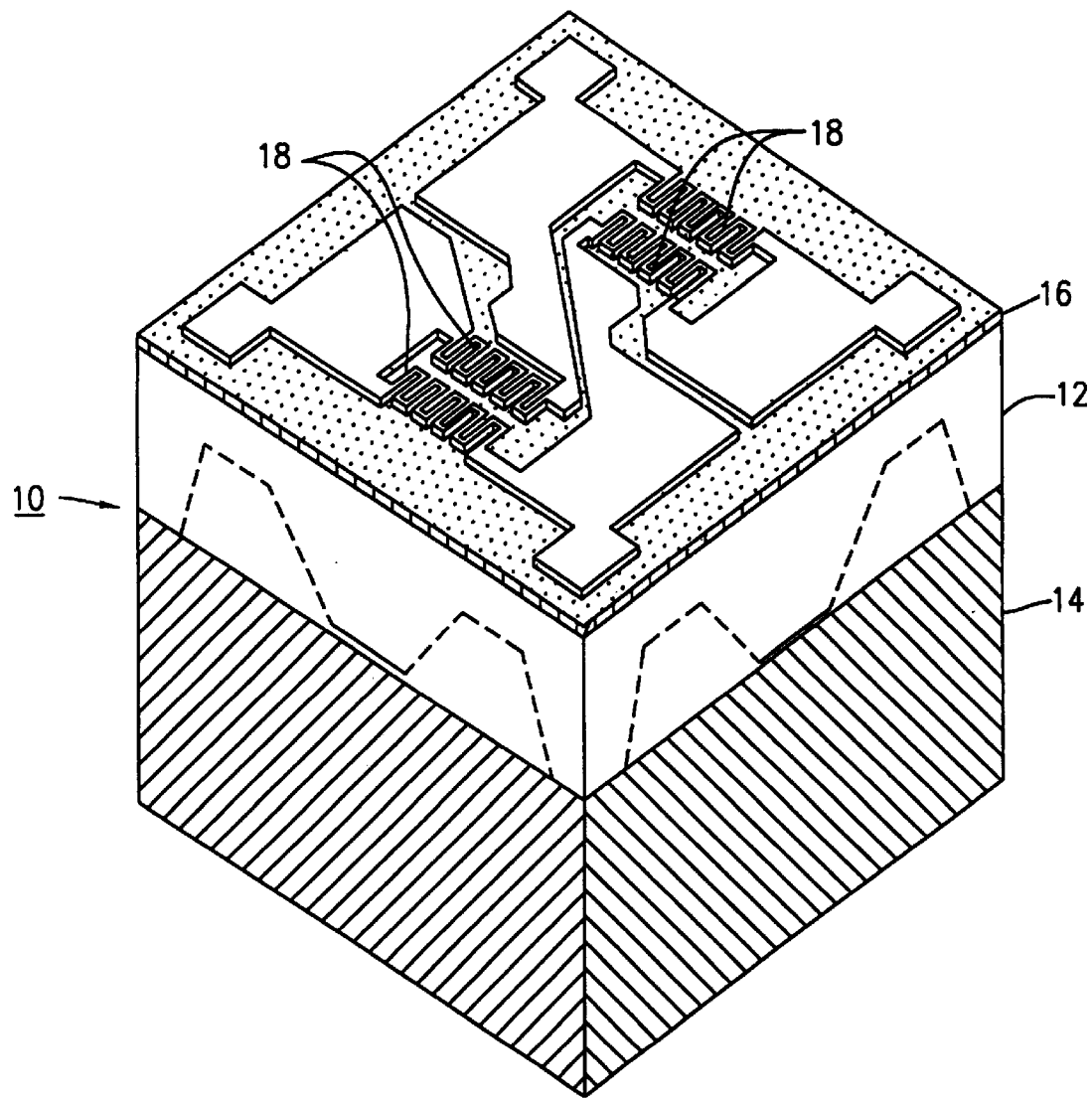
FIG. 1C is an isometric view of the silicon-on-oxide pressure transducer of FIGS. 1A and 1B.
Figure 1D:
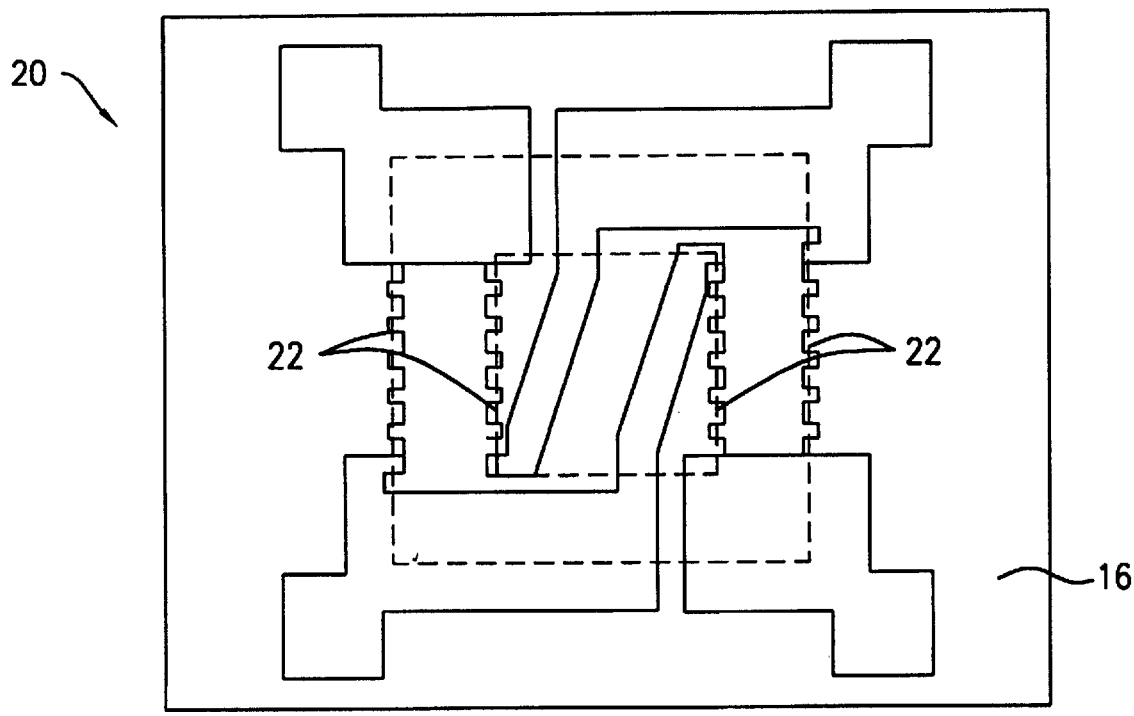
FIG. 1D is a top view depicting a diffused pressure transducer.
Figure 1E:
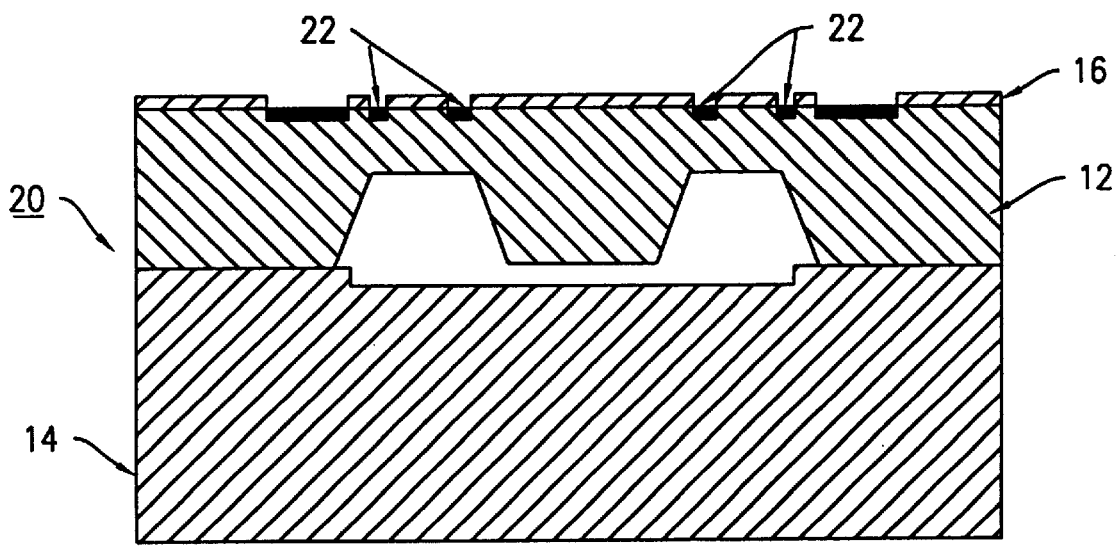
FIG. 1E is a cross-sectional view depicting the diffused pressure transducer of FIG. 1D.

The method of the present invention can be utilized to hermetically seal the raised feature sensing network of a silicon-on-oxide pressure transducer 10 as shown in the illustrative embodiment of FIGS. 1A–1C. The present invention can also be utilized to hermetically seal the depressed feature sensing network of a diffused pressure transducer 20 as shown in the illustrative embodiment of FIGS. 1D and 1E.

The pressure transducer 10 shown in FIGS. 1A–1C, includes a p+ Si stress sensing network 18 which is dielectrically isolated from the carrier substrate 12 by a dielectric isolation layer 16. The pressure transducer 20 shown in FIGS. 1D and 1E, includes a p+ stress sensing network which is diffused into the carrier substrate 12.

For the purpose of illustration only, the present invention will be described in conjunction with a silicon-on-oxide semiconductor pressure transducer similar to that shown in FIGS. 1A–1C. It should be understood, however, that the method of the present invention can also be used to hermetically seal a diffused semiconductor pressure transducer 20 similar to the one shown in FIGS. 1D and 1E.

The fabrication of a single silicon-on-oxide pressure transducer is depicted in FIGS. 2A–2E for illustration only. It should be understood, however, that in the description which follows, more than one transducer can be obtained from the composite wafer structure to be described.

A silicon-on-oxide pressure transducer such as the one shown in FIG. 1A, can be fabricated using conventional processes known in the art. A preferred process is described in U.S. Pat. No. 5,286,671 entitled FUSION BONDING TECHNIQUE FOR USE IN FABRICATING SEMICONDUCTOR DEVICES, to A. Kurtz et al., issued February 1994, the subject matter of which is incorporated herein by reference. In accordance with the '671 patent, a silicon-on-oxide pressure transducer is fabricated as follows.

Figure 2A:
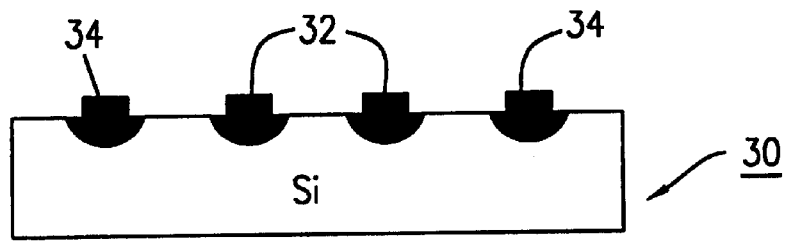
FIGS. 2A–2E are cross-sectional views depicting the fabrication of a silicon-on-oxide pressure transducer.
Figure 2B:
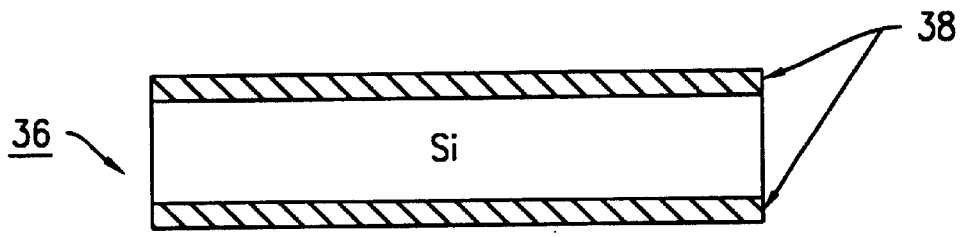
Figure 2C:
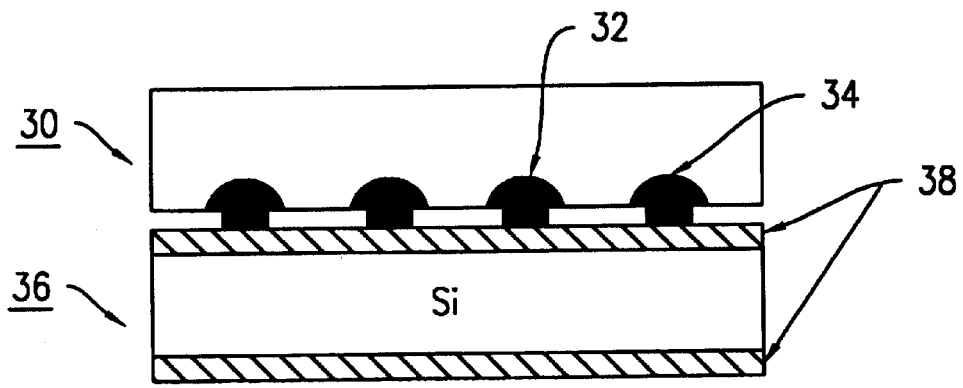
Figure 2D:
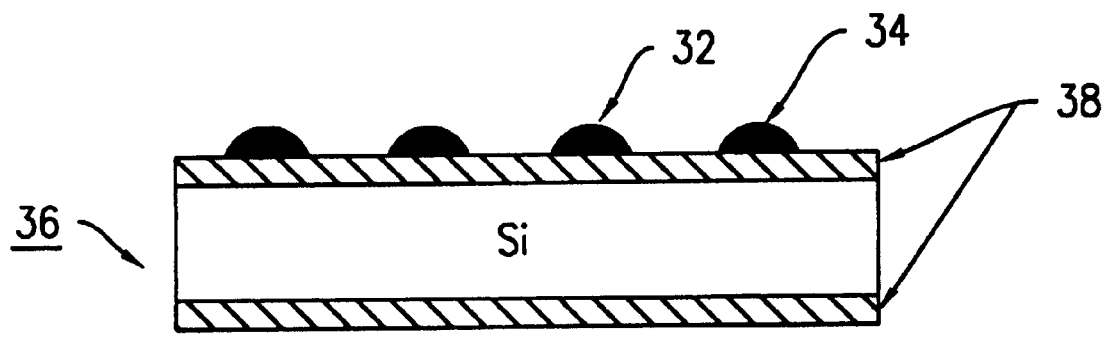

In FIG. 2A, an n-type sacrificial/pattern wafer 30 has been selected and high conductivity p+ areas, which form a stress sensing piezoresistive pattern 32, lead-outs (not visible) and electrical contact regions 34, have been created therein by diffusion using oxide and/or nitride masking and photolithography. After diffusion, the surface of the wafer 30 is treated with a conductivity-selective etch which does not attack the p+ areas, leaving them raised from the surface as shown in FIG. 2A. The sacrificial wafer 30 is then fusion-bonded to a carrier wafer 36 shown in FIG. 2B which has been previously treated to obtain a 5000 Å to 15,000 Å silicon dioxide layer 38 thereon. The oxide layer 38 can be formed in a direct oxidation technique whereby the wafer 36 is heated in a high temperature furnace to approximately 1000° C.–1300° C. and passing oxygen over the surface thereof. After fusion bonding as shown in FIG. 2C, the n-type material of the sacrificial wafer 30 is removed using a conductivity-selective etch, leaving only the p+ piezoresistive sensor patterns 32, the lead-outs (not visible) and the contact areas 34 bonded to the carrier wafer 36 as shown in FIG. 2D.

Figure 2E:
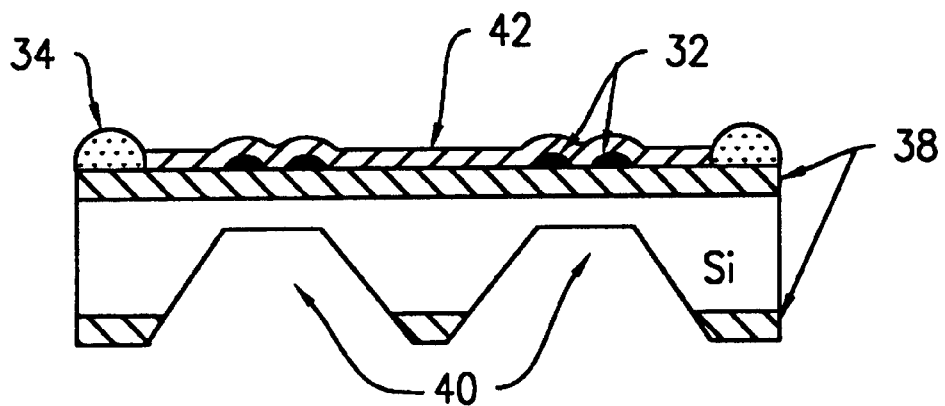
Figure 3A:
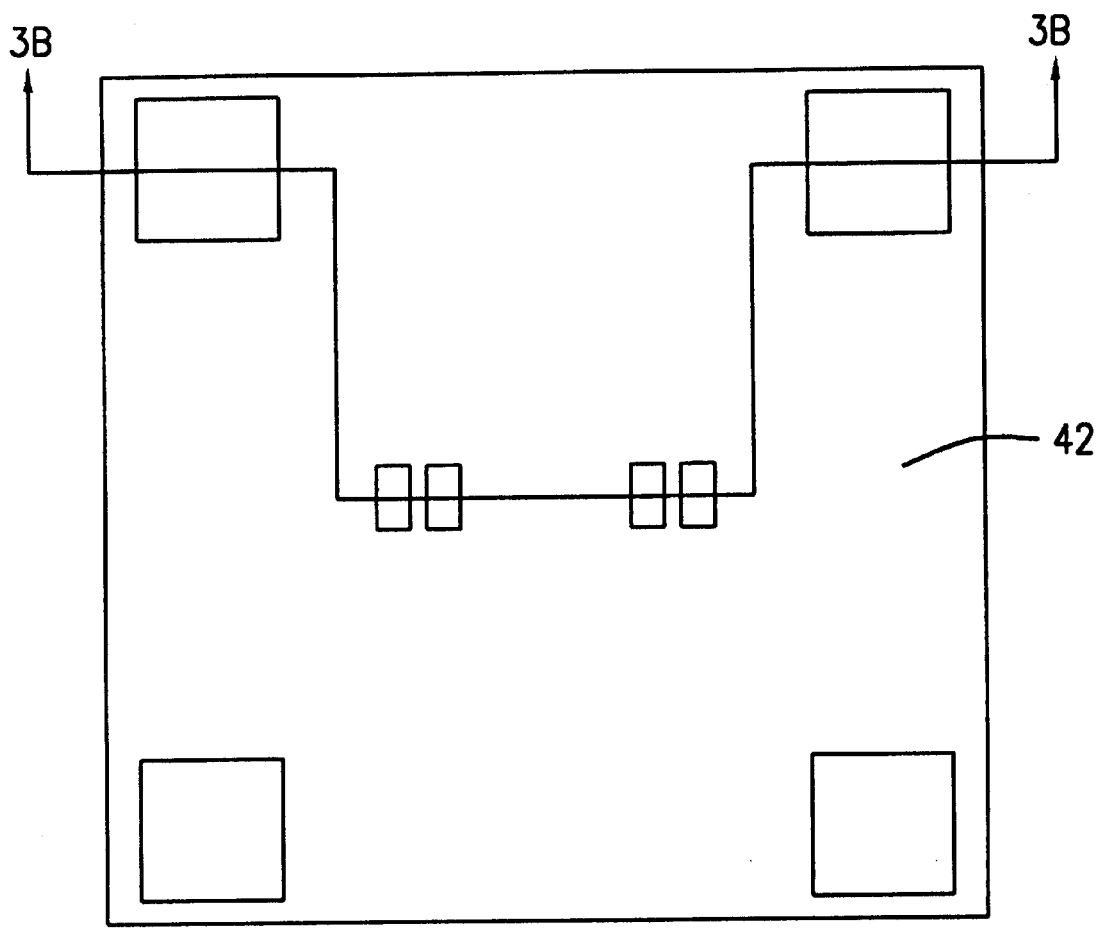
FIG. 3A is a top view of a transducer structure initially processed according to the method of the present invention.
Figure 3B:
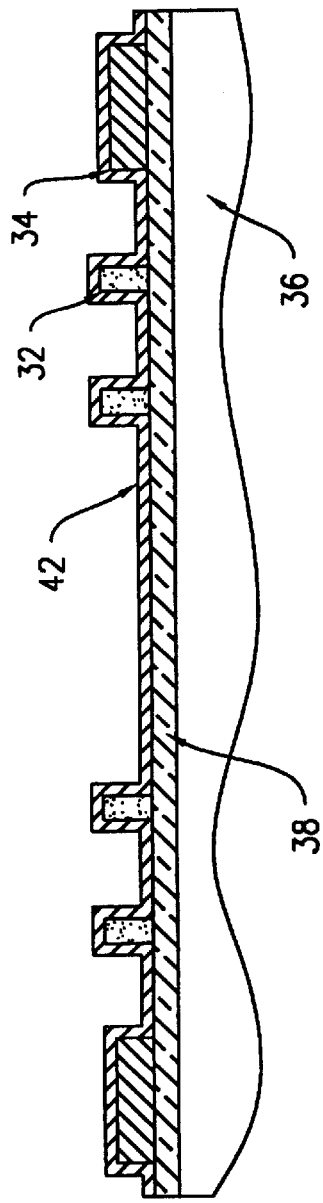
FIG. 3B is a cross-sectional side view through line 3B—3B of FIG. 3A.

In FIG. 2E, the carrier wafer 36 itself has been shaped to provide a diaphragm structure 40 using well known etching techniques as taught in U.S. Pat. No. 4,236,137 entitled SEMICONDUCTOR TRANSDUCER EMPLOYING FLEXURE FRAMES to Kurtz et al., November, 1980, and assigned to the assignee herein, which patent is incorporated herein by reference. As can be seen, the stress sensing network 32 and its associated contacts 34 (which have been metallized with $PtSi_2$/Ti/Pt layer) are stepped up and form a surface with an uneven topography in combination with the oxide layer 38 making it virtually impossible to form a hermetic seal by electrostatically or fusion bonding a cover member (not shown) to the inactive portion of the diaphragm. In accordance with the method of the present invention, as depicted in FIGS. 3A and 3B, the entire sensing surface of the carrier wafer 36 (as depicted in prior art FIG. 2e) has been reoxidized and nitrided resulting in a silicon dioxide ($SiO_2$) and/or silicon nitride ($Si_3N_4$) layer 42, also referred to herein as the underlying Si layer 42, as it underlies the sputtered silicon layer 44, as further explained below preferably on the order of 1–5 thousand Angstroms on the raised portion of the sensing surface. This insures that the planar surface layer to be later formed, will be dielectrically isolated from the sensor networks, the lead-outs and the metalized contact pads.

Figure 3C:
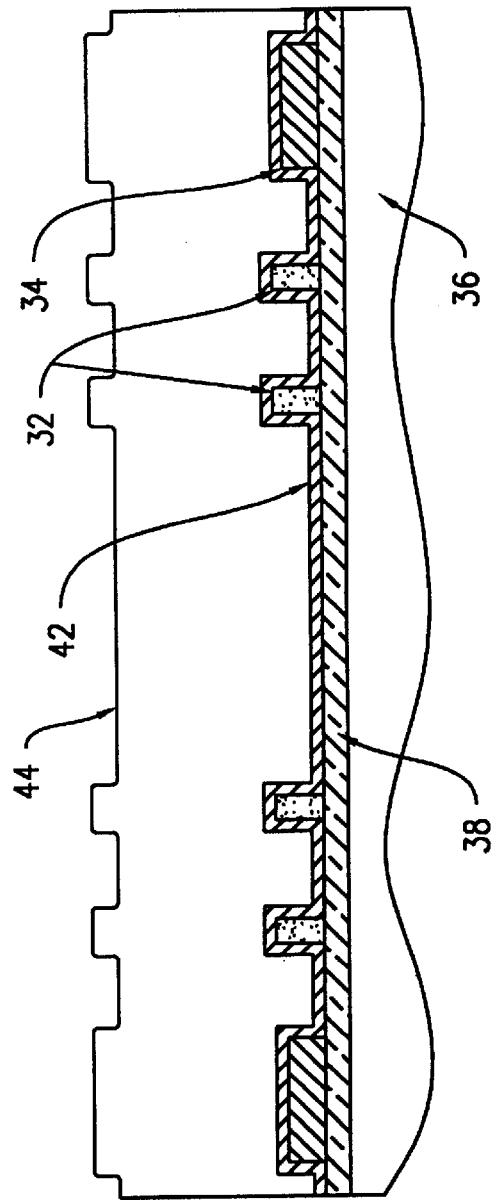

In FIG. 3C, a layer of silicon 44 is sputtered or otherwise formed over the underlying Si layer 42. The thickness of the sputtered silicon layer must be greater than the depth of the underlying Si layer 42, as shown in FIG. 3B. For example, if the depth of the underlying Si layer is approximately 2 microns, then the thickness of the sputtered Si layer is preferably between approximately 4 and 10 microns.

This can be seen in FIG. 3B. For example, looking at FIG. 3B, the depth of the underlying Si layer 42, reflected by the distance A, is depicted as being much larger than the depth of the sputtered Si layer 44, reflected by the distance B in FIG. 3B.

As can be seen in FIG. 3C, the resulting sputtered Si layer 44 is non-planar, as it follows the general contours of the underlying surface features. In FIG. 3D the Si layer 44 is planarized using well known polishing or equivalent techniques which removes the high areas of the sputtered Si and provides a substantially flat planar surface 46. The resulting thickness of the Si layer 44 after planarizing is preferably between 1 and 2 microns. The resulting planar surface 46, as shown in FIG. 3D, covers inactive and active regions of the diaphragm structure 40. In FIG. 3D, the active region overlays the portion of the diaphragm structure that deflects upon the application of a force thereto and is designated between the dotted lines at 48. The inactive region is designated between the dotted lines at 50.

As is well known in the art, the piezoresistive stress sensing patterns 32 described above, consist of a plurality of piezoresistive elements, each of which essentially forms a variable resistor in one of the four legs of a Wheatstone bridge circuit where the respective resistances of each piezoresistive element varies in proportion to a force or pressure applied to the transducer. As can be seen from FIG.

3D, the piezoresistive sensing pattern 32 is located over the active areas 48 of the diaphragm structure. The electrical contacts 34 are located in the non-active areas 50 of the diaphragm structure and form the circuit nodes of the Wheatstone bridge circuit. The lead-outs (not visible) interconnect the contacts 34 with the piezoresistive elements of the sensing pattern 32.

Figures 3F, 3G:
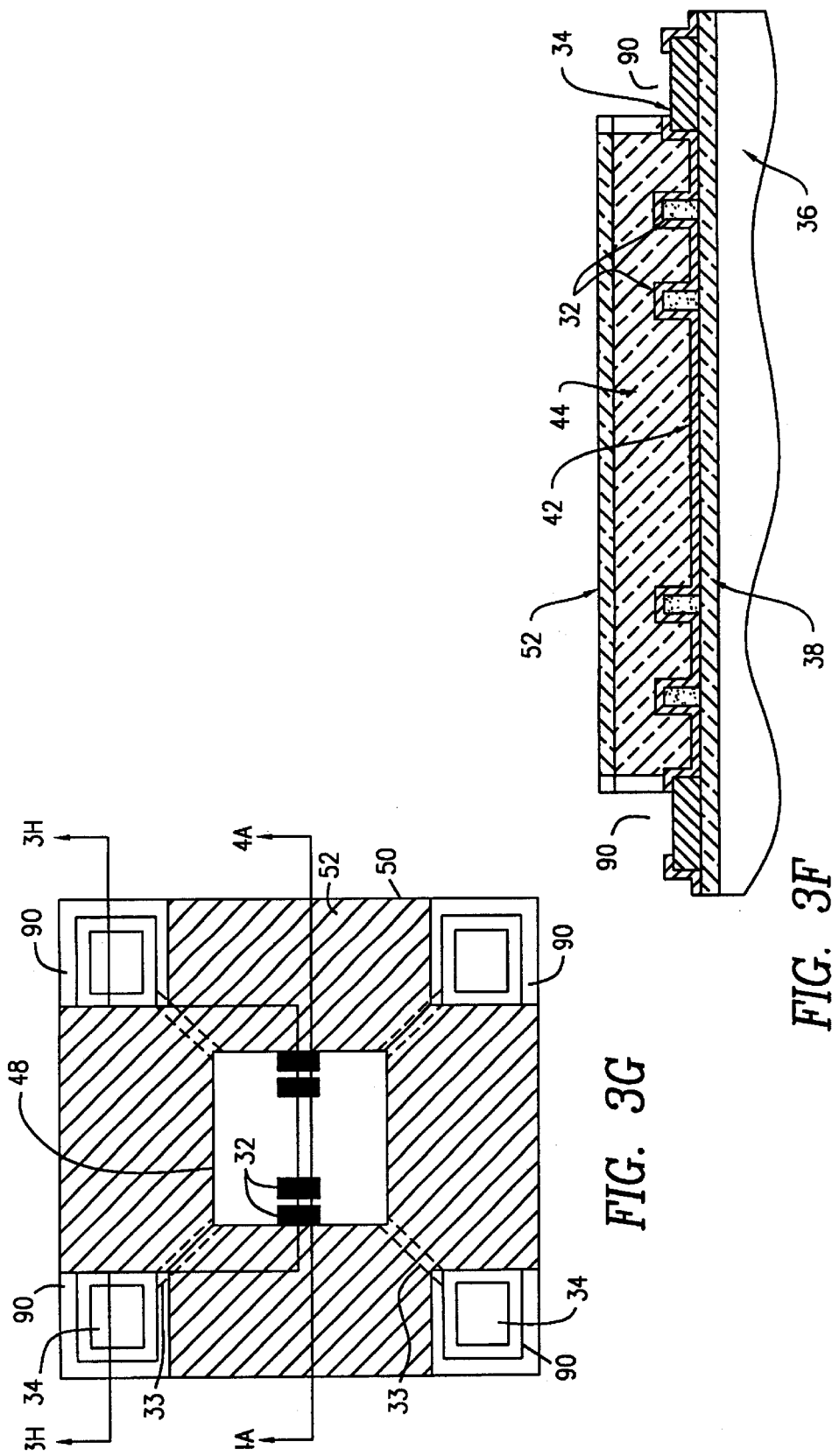
Figure 3H:
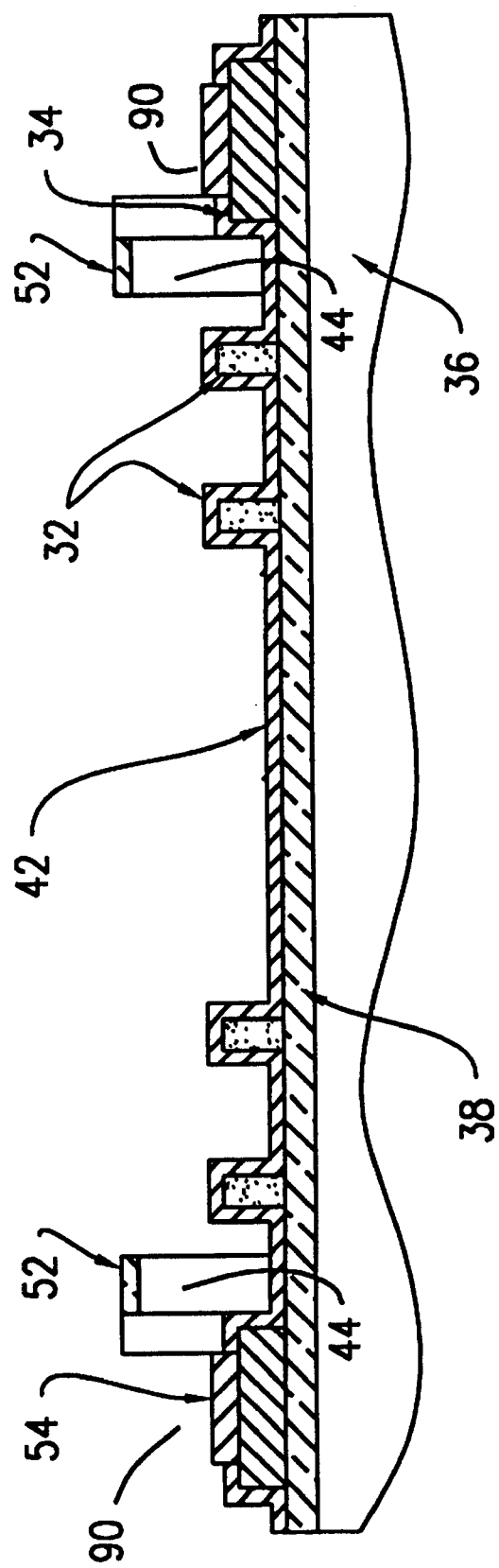
FIG. 3H is a cross-sectional side view through line 3H—3H of FIG. 3G.

The planar surface 46 provided in the inactive region 50 of the diaphragm 40 enables a cover wafer to be hermetically sealed thereto using electrostatic or fusion bonding techniques. Prior to hermetically bonding a cover wafer to the sensing side of the carrier wafer 36, the polished Si layer 44 is coated with an oxide layer 52 as shown in FIG. 3E. Next as shown in FIGS. 3F and 3G, holes or windows 90 are etched through the oxide layer 52 the sputtered Si layer 44 and layer 42 to expose the contacts 34. The contacts 34 are then metalized (metallization is designated by 54) so that external leads can be readily attached later on during transducer processing as shown in FIG. 3H.

After the contacts 34 have been metalized, a determination is made as to whether the sputtered Si layer 44 is to remain or be totally removed from the active area 48 of the diaphragm 40. This determination depends upon desired final diaphragm thickness. If the desired diaphragm thickness is on the order of 1 mil or more, the extra stiffness imparted by leaving the sputtered Si layer 44 over the active portion 48 of the diaphragm 40 will be negligible. Thus, it needn't be removed as it will act as a protective coating over the sensing network 32 to facilitate further transducer processing. If, however, the desired diaphragm thickness is between approximately 0.2 mils and 0.8 mils, the sputtered Si layer 44 lying over the active portion 48 may be removed in order to obtain the requisite sensor sensitivity. In FIGS. 3H and 3G, the sputtered Si layer 44 lying over the active portion 48 of the diaphragm 40 is shown removed after using well known etching techniques. The lead-outs designated by numeral 33 are visible in FIG. 3G, which is a top view of the carrier wafer 36 of FIG. 3F.

Figure 4A:
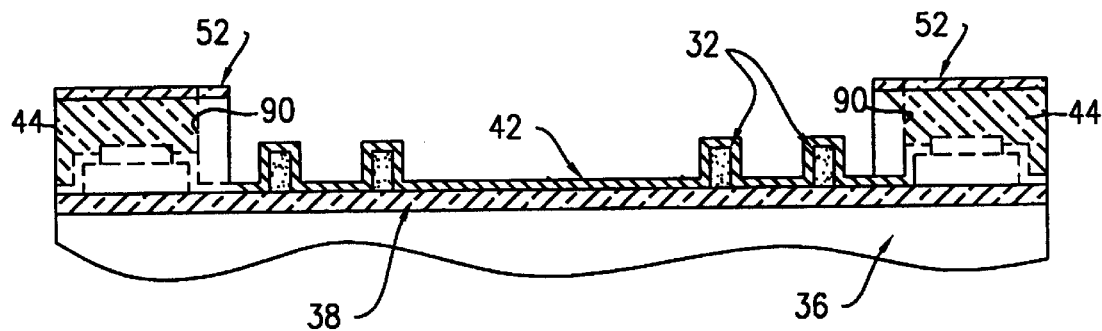
FIG. 4A is a cross-sectional side view through line 4A—4A of FIG. 3G.

The transducer structure as depicted in FIG. 4A, which is a cross-sectional side view through line 4A—4A of FIG. 3G, will now hermetically sealed. A cover 56 preferably made from Si, PYREX, or PYREX-coated Si is to be bonded to the sensing surface of the carrier wafer 36. If the cover 56 is to be fusion bonded, a Si cover is used. If, however, the cover 56 is to be electrostatically bonded, then a PYREX or PYREX-coated Si cover is used.

Figure 4B:
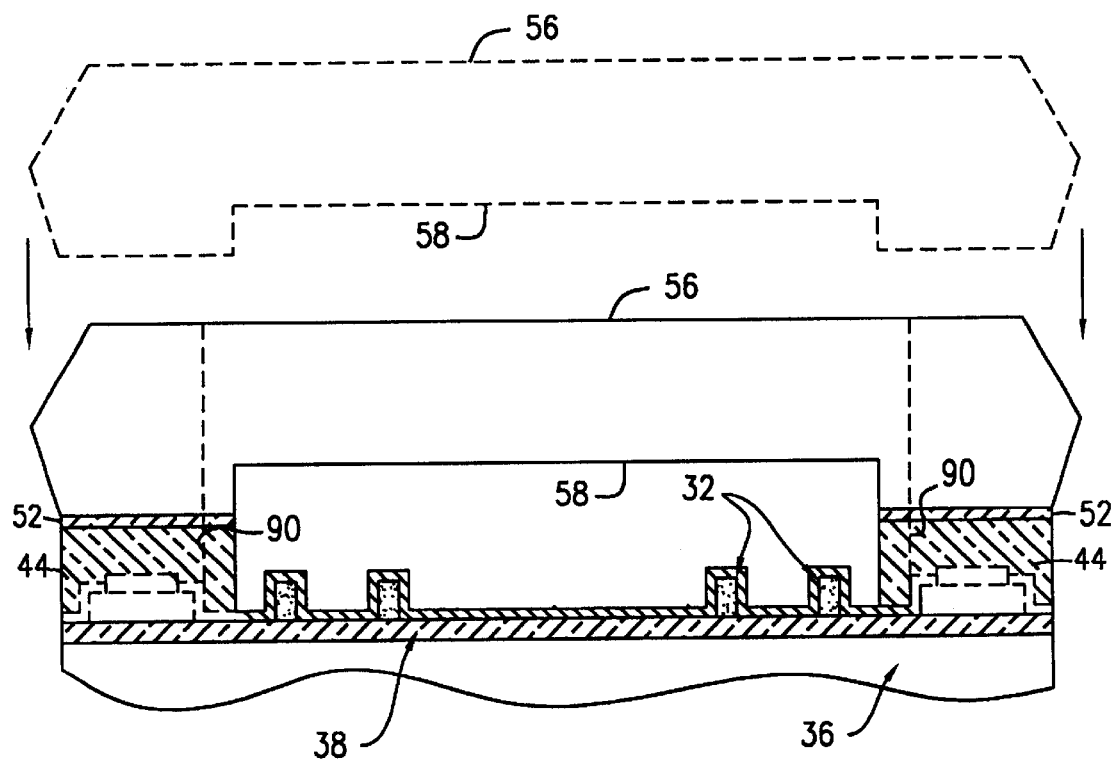
FIG. 4B is a cross-sectional view depicting the hermetic bonding of the cover to the transducer of FIG. 4A.
Figure 4C:
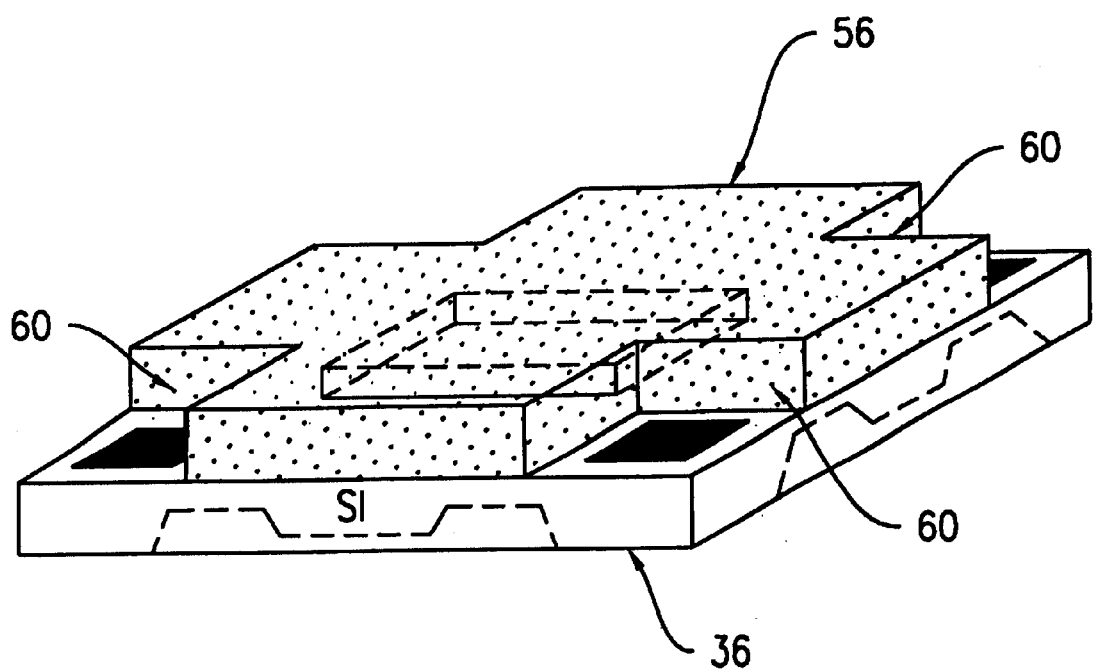
FIG. 4C is a perspective view of transducer of FIG. 4B.

As can be seen in FIG. 4B, the cover 56 includes a centrally located depression 58 which has been etched a given depth into the bottom surface thereof. The depth of the depression is selected to allow for full-scale deflection of the diaphragm without making contact with the diaphragm and to act as an over pressure stop at any greater deflection. Further, a series of corner cut-outs (not visible) are formed in the cover 56 which correspond to the metallized contacts 34. The corner cut-outs 60 can be seen in FIG. 4C which shows the transducer after hermetically bonding the cover 56 to the carrier wafer 36.

In FIG. 4B, the cover 56 is placed onto the sensing surface of the carrier wafer so that it is in position on the peripheral portion or inactive region of the carrier wafer 36. The cover 56 is then electrostatically or fusion bonded to the carrier wafer 36. Electrostatic bonding is well known in the art and involves heating the wafers while simultaneously providing a small current flow through the composite assembly. Fusion bonding involves heating the wafers at a temperature of between approximately 900° C. and 1000° C. or less, for approximately 5 to 10 minutes to bond the two wafers together. A fusion bonding technique is described in the earlier mentioned U.S. Pat. No. 5,286,671.

Figure 5A:
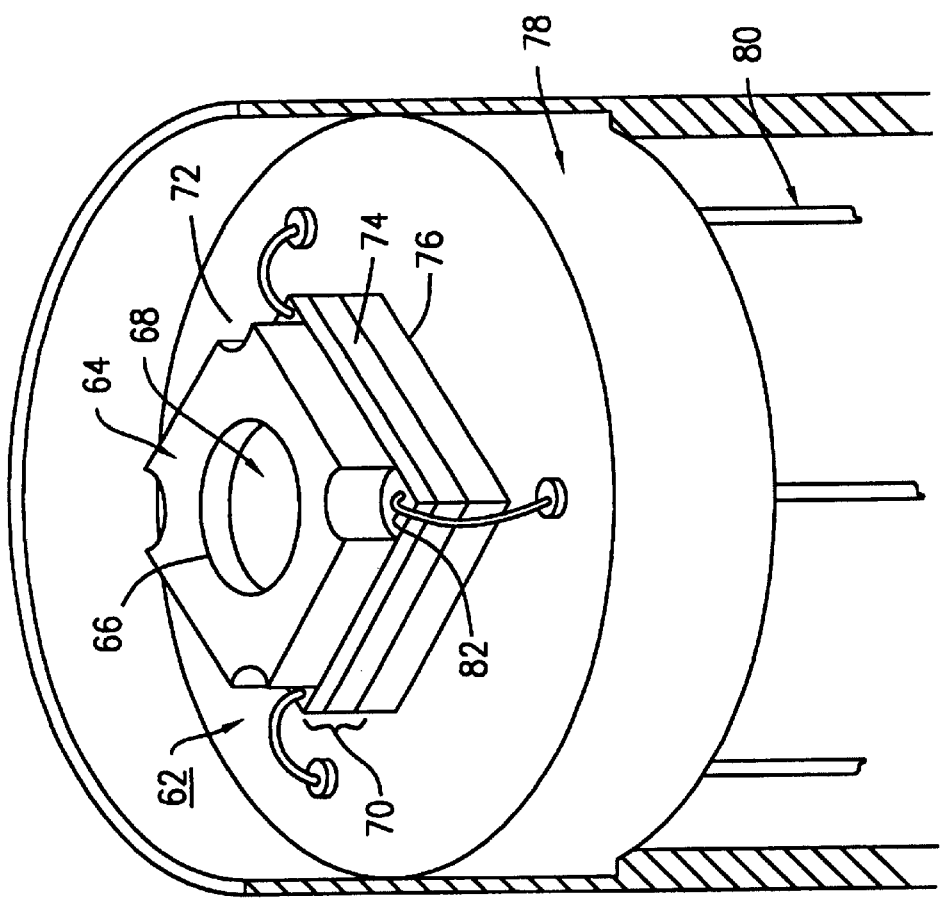
FIGS. 5A and 5B are isometric views which depict the hermetically sealed transducer made in accordance with the present invention mounted on a header.
Figure 5B:
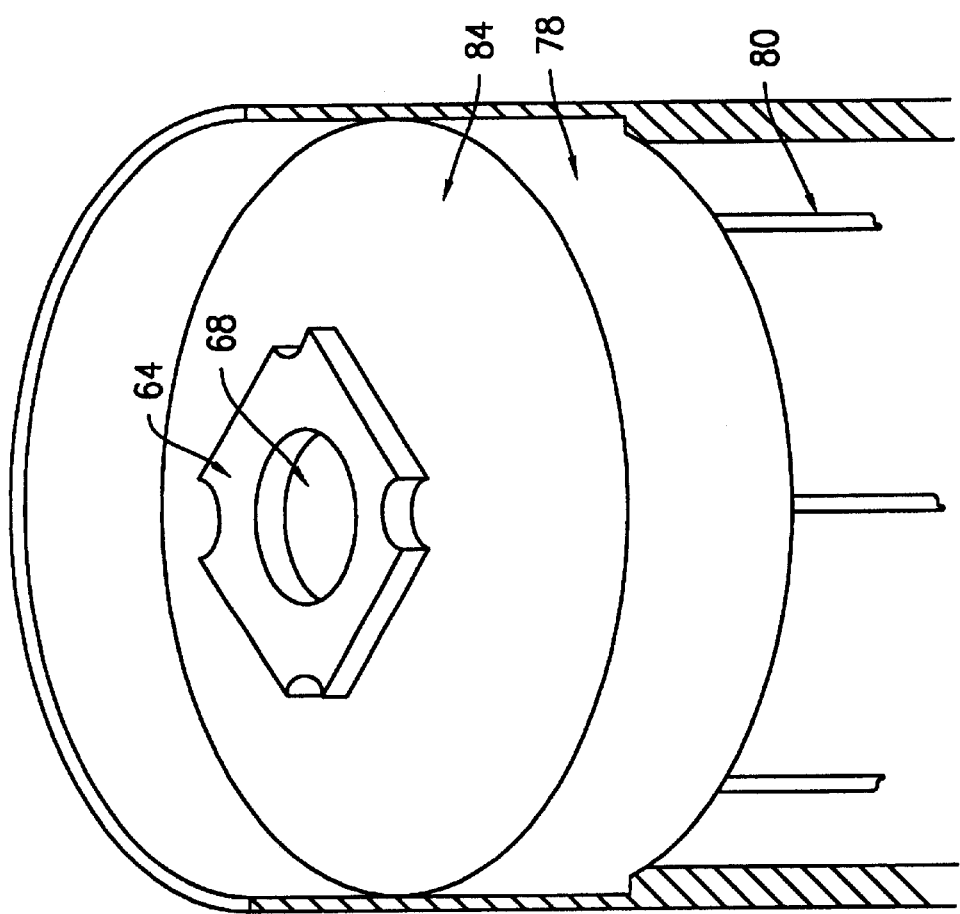

If the sputtered layer is not removed over the active portion of the diaphragm, the method of the present invention is additionally useful for pressure transducers used in applications where mounting as depicted in FIG. 5A, is required and the sensor network of the transducer 62 may be exposed to a fluid or other medium that can potentially degrade the sensor performance. For this case, the bonded cover 64 must have an aperture 66 that will connect to the sensing portion 68 of the diaphragm 70, as well as the corner cutouts 72 previously described. In addition, the carrier wafer 74 is bonded to either a piece of glass or silicon 76 on the carrier wafer's non-sensing surface. This third wafer 76 will provide the diaphragm clamping as well as make a hermetic seal on the non-sensing surface. If a gage pressure transducer is required, the third wafer structure 76 will contain an aperture (not shown) connecting to the active portion of the non-sensing side of the diaphragm 70. In the preferred embodiment, the sensor chip is mounted on a header 78 such as was disclosed in U.S. Pat. No. 4,764,747 entitled GLASS HEADER STRUCTURE FOR A SEMICONDUCTOR PRESSURE TRANSDUCER, to A. Kurtz et al., issued Aug. 16, 1988, the subject matter of which is incorporated herein by reference. Leads (not shown) are affixed to the pins 80 of the header 78 and to the contact regions of the sensor chip 62. It should be noted that the pins 80 of the header 78 are below the level of the contact pads 82 to the sensor 62. Moreover, the top surface of the cover is above the level of the contact pads 82, therefore, both the area around the contact pads and all of the space within the header down to the surface of the pins, can be potted with an insulator 84 as shown in FIG. 5B, thus, providing dielectric isolation for the contacts, the leads and the pins and, therefore, affording environmental isolation.

Further, the method of the present invention also provides an unexpected advantage in embodiments where the sputtered Si layer remains over the sensor network as earlier described. In such an embodiment, the thermal expansion coefficient of the sputtered Si is greater than the thermal expansion coefficient of the oxide to which the sensor network is bonded. For thin diaphragms, this will result in less curvature as a function of temperature and hence, improve both the temperature coefficient of zero shift as well as the temperature coefficient of sensitivity.

It should be understood that the embodiments described herein are merely exemplary and that a person skilled in the art may make many variations and modifications to these embodiments utilizing functionally equivalent elements to those described herein. Any and all such variations or modifications as well as others which may become apparent to those skilled in the art, are intended to be included within the scope of the invention as defined by the appended claims.

We claim:

1. A sealed semiconductor transducer, comprising:
   a diaphragm having a portion of which defines an active region and a portion of which defines an inactive region, said diaphragm having a top surface;
   a first isolation layer disposed on said top surface of said diaphragm, said first isolation layer overlying both said active region and said inactive region of said diaphragm, said first isolation layer having a top surface;
   a network layer disposed on said top surface of said first isolation layer, said network layer having stress sensing means disposed over said active region of said diaphragm, contact means disposed over said inactive region of said diaphragm, and interconnection means for coupling said stress sensing means to said contact means, wherein said first isolation layer dielectrically isolates said stress sensing means, said contact means, and said interconnection means from said diaphragm and wherein said network layer in combination with said first isolation layer forms a surface with an uneven topography;

a second isolation layer disposed on said network layer, said second isolation layer conforming to said surface with an uneven topography, said second isolation layer having a top surface;

a layer of semiconductor material having first and second opposing surfaces, said first opposing surface disposed on said top surface of said second isolation layer at least over said inactive portion of said diaphragm, said second opposing surface being planar, said second isolation layer dielectrically isolating said network layer from said layer of semiconductor material;

a third isolation layer disposed on said second opposing planar surface of said layer of semiconductor material, and a borosilicate glass cover member bonded to said third isolation layer over said inactive region of said diaphragm for sealing said stress sensing means.

2. The transducer according to claim 1, wherein said cover member hermetically seals said stress sensing means.

3. The transducer according to claim 1, wherein said first isolation layer comprises an oxide layer.

4. The transducer according to claim 1, wherein said semiconductor material comprises silicon.

5. The transducer according to claim 4, wherein said second isolation layer is fabricated with a silicon compound.

6. The transducer according to claim 5, wherein said second isolation layer is fabricated with a silicon compound selected from the group consisting of silicon dioxide ($SiO_2$) and silicon nitride ($Si_3N_4$).

7. The transducer according to claim 5, wherein holes are etched in said second and third isolation layers and said layer of semiconductor material to permit access to said contact means.

8. The transducer according to claim 7, wherein a metal layer is formed in the contact means.

9. The transducer according to claim 1, wherein the cover member has a series of apertures corresponding to the various contact means of the transducer.

10. The transducer according to claim 1, wherein said cover member has a recessed region in a central portion thereof, said recessed region operating to prevent said cover member from contacting said stress sensing means, and further operating as an overpressure stop.

11. The transducer according to claim 1, wherein the layer of semiconductor material overlies the active and inactive areas of the diaphragm.

12. The transducer according to claim 1, wherein said stress sensing means, said contact means and said interconnection means are comprised of highly doped silicon.

13. A sealed semiconductor transducer, comprising:

a diaphragm having a portion of which defines an active region and a portion of which defines an inactive region, said diaphragm having a top surface;

a first isolation layer disposed on said top surface of said diaphragm, said first isolation layer overlying both said active region and said inactive region;

a network layer disposed on said top surface of said first isolation layer, said network layer having stress sensing means disposed over said active region of said diaphragm, contact means disposed over said inactive region of said diaphragm, and interconnection means for coupling said stress sensing means to said contact means, wherein said first isolation layer dielectrically isolates said stress sensing means, said contact means, and said interconnection means from said diaphragm and wherein said network layer in combination with said first isolation layer forms a surface with an uneven topography;

a second isolation layer disposed on said network layer, said second isolation layer conforming to said surface with an uneven topography said second isolation layer having a top surface;

a layer of semiconductor material having first and second opposing surfaces, said first opposing surface disposed on said top surface of said second isolation layer at least over said inactive portion of said diaphragm, said second opposing surface being planar, said second isolation layer dielectrically isolating said network layer from said layer of semiconductor material;

an oxide layer disposed on said second opposing planar surface of said layer of semiconductor material; and a cover member bonded to said oxide layer for hermetically sealing said stress sensing means.

* * * * *